United States Patent
Kim et al.

(10) Patent No.: US 8,158,501 B2
(45) Date of Patent: Apr. 17, 2012

(54) COMPOUND SEMICONDUCTOR SUBSTRATE GROWN ON METAL LAYER, METHOD OF MANUFACTURING THE SAME, AND COMPOUND SEMICONDUCTOR DEVICE USING THE SAME

(75) Inventors: Yong-Jin Kim, Gumi (KR); Doo-Soo Kim, Gumi (KR); Ho-Jun Lee, Gumi (KR); Dong-Kun Lee, Gumi (KR)

(73) Assignee: Siltron, Inc., Gumi (KR)

( * ) Notice: Subject to any disclaimer, the term of this patent is extended or adjusted under 35 U.S.C. 154(b) by 0 days.

(21) Appl. No.: 12/967,897

(22) Filed: Dec. 14, 2010

(65) Prior Publication Data

US 2011/0092055 A1 Apr. 21, 2011

Related U.S. Application Data

(62) Division of application No. 11/982,716, filed on Nov. 2, 2007.

(30) Foreign Application Priority Data

Nov. 7, 2006 (KR) .................. 10-2006-0109308

(51) Int. Cl.
*H01L 21/02* (2006.01)
(52) U.S. Cl. ... 438/590; 438/602; 438/604; 257/E21.09; 257/E23.069
(58) Field of Classification Search .............. 438/590, 438/602, 603, 604, 605, 606, 607, 669, 748; 257/E21.09, E23.069, 9; 427/250
See application file for complete search history.

(56) References Cited

U.S. PATENT DOCUMENTS

| 3,202,543 | A | * | 8/1965 | Thun et al. ............ 216/13 |
| 5,865,657 | A | * | 2/1999 | Haven et al. .......... 445/24 |
| 6,239,005 | B1 | | 5/2001 | Sumiya et al. |
| 0,077,156 | A1 | | 4/2004 | Tsakalakos et al. |

(Continued)

FOREIGN PATENT DOCUMENTS

EP 1 501 117 1/2005

(Continued)

OTHER PUBLICATIONS

European Search Report issued corresponding EP Application No. EP 07 12 0215 on Feb. 1, 2012.

*Primary Examiner* — Cuong Q Nguyen
*Assistant Examiner* — Yosef Gebreyesus
(74) *Attorney, Agent, or Firm* — Greer, Burns & Crain, Ltd.

(57) ABSTRACT

The present invention relates to a compound semiconductor substrate and a method for manufacturing the same. The present invention provides the manufacturing method which coats spherical balls on a substrate, forms a metal layer between the spherical balls, removes the spherical balls to form openings, and grows a compound semiconductor layer from the openings. According to the present invention, the manufacturing method can be simplified and grow a high quality compound semiconductor layer rapidly, simply and inexpensively, as compared with a conventional ELO (Epitaxial Lateral Overgrowth) method or a method for forming a compound semiconductor layer on a metal layer. And, the metal layer serves as one electrode of a light emitting device and a light reflecting film to provide a light emitting device having reduced power consumption and high light emitting efficiency.

11 Claims, 3 Drawing Sheets

U.S. PATENT DOCUMENTS

| | | |
|---|---|---|
| 6,723,165 B2 | 4/2004 | Ogawa et al. |
| 0,183,090 A1 | 9/2004 | Kitaoka et al. |
| 7,351,607 B2 * | 4/2008 | Wang et al. .............. 438/99 |
| 7,554,125 B2 | 6/2009 | Kwak |
| 2003/0107047 A1 | 6/2003 | Okuyama et al. |
| 2004/0195958 A1 | 10/2004 | Ito et al. |
| 2005/0029507 A1 | 2/2005 | Usui et al. |
| 2007/0085093 A1 | 4/2007 | Ohmae et al. |

FOREIGN PATENT DOCUMENTS

| | | |
|---|---|---|
| EP | 1 560 259 | 8/2005 |
| JP | 2002-324758 | 11/2002 |
| JP | 2003-34599 | 2/2003 |
| JP | 2006-128631 | 5/2006 |
| KR | 1020000056002 A | 9/2000 |
| KR | 1020060098977 A | 9/2006 |
| TW | 589656 | 6/2004 |

\* cited by examiner (a)

(b)

COMPOUND SEMICONDUCTOR SUBSTRATE GROWN ON METAL LAYER, METHOD OF MANUFACTURING THE SAME, AND COMPOUND SEMICONDUCTOR DEVICE USING THE SAME

This is a divisional of application Ser. No. 11/982,716, filed Nov. 2, 2007.

BACKGROUND OF THE INVENTION

1. Field of the Invention

The present invention relates to a compound semiconductor substrate used in manufacturing a light emitting device and a method for manufacturing the same, and in particular, to a method for manufacturing a compound semiconductor substrate, which is capable of manufacturing a semiconductor substrate having a compound semiconductor layer grown on a metal layer easily and inexpensively, and to a compound semiconductor substrate and a compound semiconductor device manufactured thereby.

2. Description of the Related Art

Gallium nitride (GaN) as a typical compound semiconductor is known as a material suitable for application to a blue light emitting device or a high temperature electronic device. Recently, as the blue light emitting device is a sharp rise in demand, a demand for a GaN substrate is increasing. However, a high quality GaN substrate is very difficult to manufacture, and thus requires much manufacturing cost and time. For examples, an ELO (Epitaxial Lateral Overgrowth) method used widely in manufacturing a high quality GaN substrate uses a $SiO_2$ mask of a stripe shape to reduce stress that is caused by differences in lattice constant and thermal expansion coefficient between a substrate and a GaN crystal. That is, the ELO method grows a GaN film on a substrate, takes the substrate having the grown GaN film out of a reactor, charges the substrate in a deposition equipment to form a $SiO_2$ film on the GaN film, takes the substrate having the deposited $SiO_2$ film out of the deposition equipment, forms an $SiO_2$ mask pattern using photolithography, and charges the substrate in the reactor again to form a GaN layer (for more information, see Korean Patent No. 455277). However, disadvantageously the ELO method goes through a complex process as mentioned above, requires much process time, and has problems in reproducibility and yield.

Meanwhile, it is also an important issue to achieve improvement of light emitting efficiency or reduction of power consumption of a light emitting device manufactured using the above-mentioned compound semiconductor. That is, light generated from an active layer of a light emitting device is emitted toward a surface of the light emitting device and besides is emitted toward a substrate, so that the light is absorbed by the substrate, thereby reducing a light emitting efficiency. To solve the problem, an attempt is made to reflect scatteringly the light that is generated from the active layer and emitted toward the substrate, using a patterned substrate to reduce penetration or absorption by the substrate, thereby increasing a light emitting efficiency toward the surface of the light emitting device. However, this attempt has disadvantages of a complex process and much time required to make the patterned substrate.

And, U.S. Pat. No. 6,239,005 suggests a technique for forming an epitaxial platinum layer on a surface of a sapphire substrate and growing a GaN layer thereon by metalorganic vapor phase epitaxy. That is, this technique uses the platinum layer both as a reflecting mirror and a lower electrode to achieve improvement of light emitting efficiency and reduction of electrical resistance. However, essentially it is difficult to grow a GaN layer on a metal layer, and thus this US Patent uses such a costly process that defines a specific crystal face of an electrically insulating substrate having a single crystal structure as a surface to be layered, epitaxially grows a platinum layer on the specific face in the direction of a specific crystal orientation and epitaxially grows a GaN layer thereon.

As such, actually it requires a costly and complex process such as photolithography to manufacture a high quality compound semiconductor substrate with few crystal defects, and it requires a costly process to achieve improvement of light emitting efficiency and reduction of power consumption. Further, in spite of high cost, problems of low reproducibility and yield are left unsettled.

SUMMARY OF THE INVENTION

Therefore, the present invention is designed to solve the above-mentioned problems of the prior arts, and therefore it is an object of the present invention to provide a high quality and efficiency compound semiconductor substrate and a method for manufacturing the same simply and inexpensively.

In order to achieve the above-mentioned objects, the present invention uses spherical balls, instead of using a complex and costly photolithography or a technique for epitaxially growing a compound semiconductor layer on an epitaxially grown metal layer.

According to the present invention, a method for manufacturing a compound semiconductor substrate includes (a) preparing a plurality of spherical balls; (b) coating a plurality of the spherical balls on a substrate; (c) depositing a metal layer on the substrate coated with the spherical balls with a thickness smaller than size of the spherical balls; (d) removing a plurality of the spherical balls from the substrate having the metal layer deposited thereon; (e) growing a compound semiconductor layer from a surface of the substrate exposed by removing a plurality of the spherical balls; (f) growing the compound semiconductor layer in a lateral direction to form a continuous compound semiconductor layer on the metal layer; and (g) growing the compound semiconductor layer to a target thickness.

Here, the spherical balls may include silicon oxide ($SiO_2$) balls, sapphire ($Al_2O_3$) balls, titanium oxide ($TiO_2$) balls, zirconium oxide ($ZrO_2$) balls, $Y_2O_3$—$ZrO_2$ balls, copper oxide (CuO, $Cu_2O$) balls, tantalum oxide ($Ta_2O_5$) balls, PZT (Pb(Zr, Ti)$O_3$) balls, $Nb_2O_5$ balls, $FeSO_4$ balls, $Fe_3O_4$ balls, $Fe_2O_3$ balls, $Na_2SO_4$ balls, $GeO_2$ balls or CdS balls, and it is preferable to use silicon oxide balls in aspect of size or easiness of manufacture.

And, the spherical balls may be coated on the substrate by a simple method such as a dip coating method or a spin coating method, and removed simply through an ultrasonic cleaning method or a chemical etching method.

And, the metal layer may be made of Pt, Ti, Cr, Al or Cu, and deposited by typical sputtering or evaporation method.

As such, the manufacturing method of the present invention is performed by a simple and low price process without a delicate control.

A compound semiconductor substrate manufactured by the above-mentioned method according to the present invention, includes a substrate; a metal layer stacked on the substrate and having a plurality of circular openings, through which a surface of the substrate is exposed; and a compound semiconductor layer grown from the surface of the substrate exposed by a plurality of the circular openings to fill the openings and cover the metal layer.

And, according to the present invention, a compound semiconductor device may be manufactured using the above-mentioned compound semiconductor substrate, the compound semiconductor layer includes a first conductivity type compound semiconductor layer; an active layer formed on the first conductivity type compound semiconductor layer; and a second compound semiconductor layer formed on the active layer, and the compound semiconductor device uses the metal layer as a first electrode and includes a second electrode formed on the second conductivity type compound semiconductor layer.

Therefore, the compound semiconductor device of the present invention can use the metal layer both as a reflecting film and an electrode to achieve improvement of light emitting efficiency and reduction of power consumption.

DESCRIPTION OF THE PREFERRED EMBODIMENT

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. In the case that the following description shows a layer exists on another layer, this may be interpreted that the layer may exist directly on another layer or a third layer may be interposed therebetween.

Figure 1:
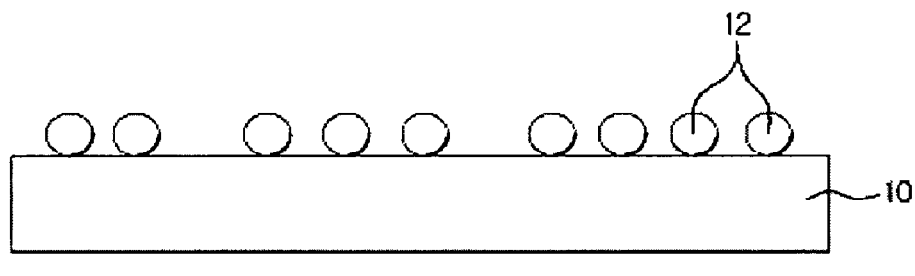
FIGS. 1 to 6 are views illustrating a method for manufacturing a compound semiconductor substrate and a compound semiconductor device according to a preferred embodiment of the present invention.
Figure 1:
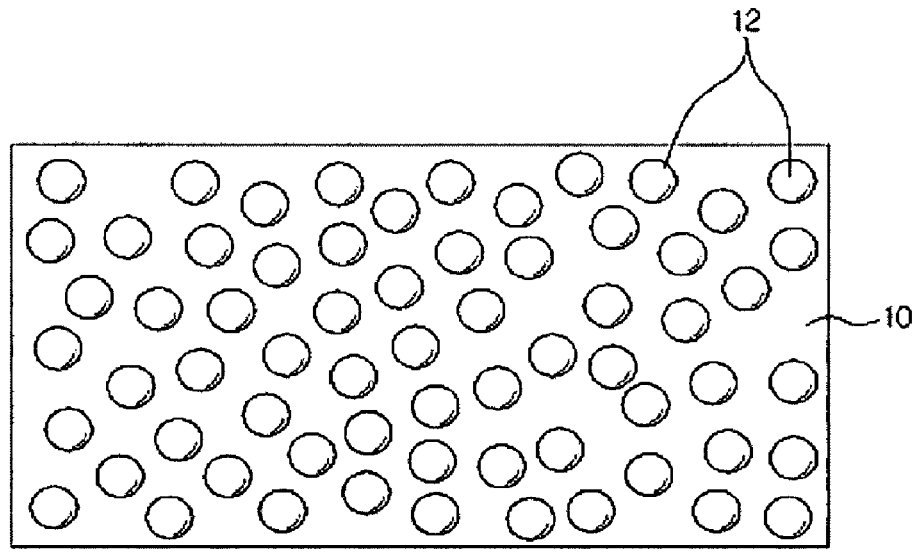

FIGS. 1 to 6 are schematic views illustrating a method for manufacturing a compound semiconductor substrate and a compound semiconductor device using the same according to a preferred embodiment of the present invention. FIG. 1 (a) and FIGS. 2 to 6 are cross-sectional views, and FIG. 1 (b) is a plan view (plan views are omitted in FIG. 2 and thereafter). In drawings, thickness or size of each layer is exaggerated for convenience and clarity of description. Same reference numeral indicates the same element in drawings.

Referring to FIG. 1, first, spherical balls 12 are prepared and coated on a substrate 10. The spherical balls 12 may be prepared by making them using various materials or purchasing them, for example, the spherical balls 12 may be silicon oxide ($SiO_2$) balls, sapphire ($Al_2O_3$) balls, titanium oxide ($TiO_2$) balls, zirconium oxide ($ZrO_2$) balls, $Y_2O_3$—$ZrO_2$ balls, copper oxide (CuO, $Cu_2O$) balls, tantalum oxide ($Ta_2O_5$) balls, PZT (Pb(Zr, Ti)$O_3$) balls, $Nb_2O_5$ balls, $FeSO_4$ balls, $Fe_3O_4$ balls, $Fe_2O_3$ balls, $Na_2SO_4$ balls, $GeO_2$ balls or CdS balls. The size (diameter) of the spherical balls 12 may be selected variously from several nanometer (nm) to several tens micrometer (μm) according to kind and size of a compound semiconductor device as a final product. Recently, taking into consideration that thickness of a GaN layer of a GaN substrate used as a light emitting device is typically several μm, it is preferable to use spherical balls having size of about 10 nm to about 2 μm, for example. And, for convenience of a process in which the spherical balls 12 are coated on the substrate 10 and then removed, it is preferable to use silicon oxide ($SiO_2$) balls.

In describing the manufacturing method citing silicon oxide ($SiO_2$) balls, first, to make the spherical balls 12, TEOS (tetraethyl orthosilicate) is dissolved in an anhydrous ethanol to make a first solution. And, an ammonia-dissolved ethanol, deionized water and ethanol are mixed to make a second solution. Ammonia acts as a catalyst for manufacturing spherical balls. Subsequently, the first solution and the second solution are mixed, and then stirred at a predetermined temperature during a predetermined time to form spherical, silicon oxide balls. The spherical balls are separated from the solution containing the spherical balls through centrifugal separation and cleaned by ethanol, and the cleaned spherical balls are dispersed in an ethanol solution again to obtain a spherical ball-dispersed solution similar to slurry. The spherical balls may be formed with various sizes according to manufacturing conditions, i.e. reaction time, temperature or amount of reaction materials. Meanwhile, in Korean Patent Application filed on Mar. 9, 2005 as Korean Patent Application No. 10-2005-0019605 and published on Sep. 19, 2006 as Korean Laid-open Patent Publication No. 10-2006-0098977, which is incorporated hereinto by reference, the applicant suggested a method for growing a compound semiconductor layer on a substrate coated with spherical balls. The above-identified application teaches a method for manufacturing silicon oxide balls in greater detail.

The spherical ball-dispersed solution is coated on the substrate 10 using drop, dipping or spin coating method. At this time, density of the spherical balls 12 on the substrate 10 can be controlled by suitably controlling coating time and frequency. As shown in FIG. 1, preferably the spherical balls 12 are not coated too densely, but to the extent of exposing the substrate 10 moderately. A metal layer (20 in FIG. 2 and thereafter) is formed on a surface of the substrate 10 exposed between the spherical balls 12, preferably the metal layer 20 is formed in the shape of a continuous layer so that electrical resistance is small when the metal layer 20 acts as an electrode of a compound semiconductor device. Further, it is necessary to secure an area of the metal layer 20 to such an extent that the metal layer 20 reflects light, generated from an active layer (60 of FIG. 6) to be described below and emitted toward the substrate 10, to increase an amount of light emitted toward a surface (an upper surface in FIG. 6) of a device. Meanwhile, if the spherical balls 12 are coated too sparsely, it takes much time to grow a compound semiconductor layer (50 in FIG. 5 and thereafter) from openings (30 in FIG. 3) that are to be formed by removing the spherical balls 12. Therefore, a coating density of the spherical balls 12 is controlled properly in consideration of light emitting efficiency of a light emitting device and a growth speed of a compound semiconductor layer.

The substrate 10 may be made of sapphire ($Al_2O_3$), GaAs, spinel, InP, SiC or Si, however, each of the materials has the following advantage and disadvantage, and thus is suitably selected according to an application range or the required quality. That is, a sapphire substrate has high stability at high temperature, but it has difficulty in manufacturing a large-size substrate due to its small size. And, a silicon carbide (SiC) substrate has the same crystal structure as gallium nitride (GaN), high stability at high temperature, and similar lattice constant and thermal expansion coefficient to gallium nitride (GaN), but it has a disadvantage of high cost. A silicon substrate has differences in lattice constant of about 17% and in thermal expansion coefficient of about 35% with gallium nitride (GaN), but it can be used in manufacturing a large-size substrate of 12 inches or more, thereby reducing a manufacturing cost and remarkably expanding an application range of a device manufactured therefrom.

Figure 2:
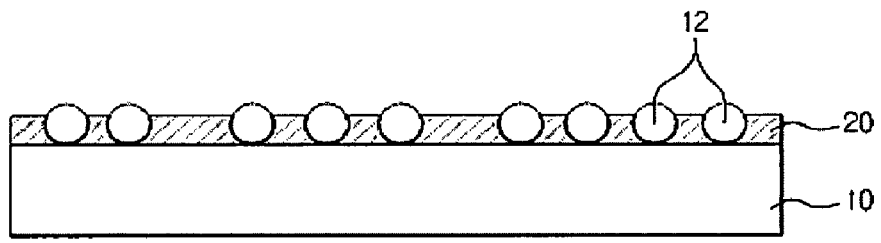

Referring to FIG. 2, the metal layer 20 is deposited on the substrate 10 coated with the spherical balls 12. It is not necessarily to form the metal layer 20 by an epitaxial growth method of delicate process conditions, and thus, in consideration of throughput, the metal layer 20 may be deposited by a sputtering method or an evaporation method. The metal layer 20 prevents light emitted from the active layer 60 from being absorbed and lost by the substrate 10, and acts as a reflecting film for reflecting light toward a surface of a light emitting device, and besides the metal layer 20 serves as one electrode of the light emitting device. Thus, it is preferable to use a material having good reflectivity and low electrical resistance, for example, Pt, Ti, Cr, Al or Cu. And, the metal layer 20 may have at least such thickness that light is not penetrated but reflected, and that is smaller than the diameter of the spherical balls 12 so that the spherical balls 12 can be removed in a subsequent step.

Subsequently, the spherical balls 12 are removed to form a plurality of substantially circular openings 30, and heat treatment may be performed before this step. That is, before the spherical balls 12 are removed, heat treatment is performed under ammonia or nitrogen atmosphere at temperature below a melting point of a metal of the metal layer 20. With the heat treatment, the metal layer 20 is reflowed to be planarized, thereby further increasing a reflectivity of light. And, the heat treatment can prevent oxidation of the metal layer 20 and allow the metal layer 20 to serve as an intermediate layer, in particular when growing a nitride-based compound semiconductor layer 50.

Figure 3:
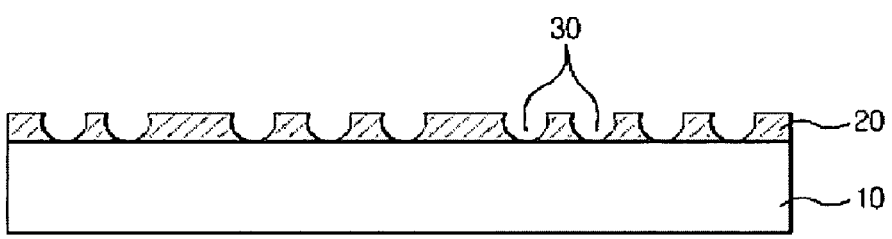

After the metal layer 20 is deposited between the spherical balls 12, or after the heat treatment is performed on the metal layer 20, the spherical balls 12 are removed. An adhesive strength between the spherical balls 12 coated on the substrate 10 and the substrate 10 is not so large, and thus the spherical balls 12 may be removed by a relatively simple method, for example, an ultrasonic cleaning method. In the case that the spherical balls 12 are not removed simply by the ultrasonic cleaning method as the metal layer 20 is deposited relatively thick, the spherical balls 12 may be removed through a chemical etching method. For examples, in the case that the spherical balls 12 are made of silicon oxide, the entire substrate 10 may be dipped into a hydrofluoric acid solution and then the spherical balls 12 may be removed by a wet etching method. Then, as shown in FIG. 3, areas formed by removing the spherical balls 12 define substantially circular openings 30, through which the substrate 10 is exposed, and the metal layer 20 having a plurality of the openings 30 are left on the substrate 10.

Figure 4:
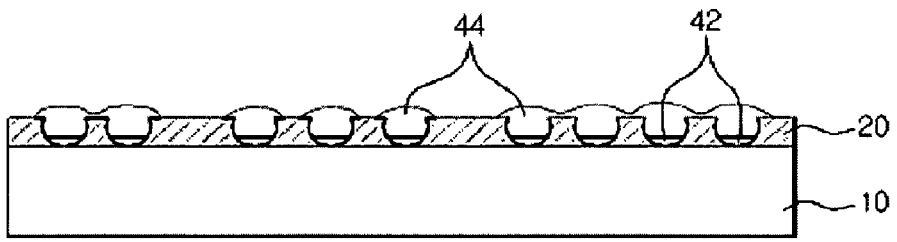

Subsequently, referring to FIG. 4, the substrate 10 having a plurality of the openings 30 formed by removing the spherical balls 12 is charged in an MOCVD (Metal Organic Chemical Vapor Deposition) apparatus to grow a buffer layer 42. In describing a process for forming the buffer layer 42 using the MOCVD method, reaction precursors are injected into a reactor at a predetermined flow speed through individual lines and then chemically reacted while maintaining the reactor at proper pressure and temperature to form the buffer layer 42 of a target thickness.

The buffer layer 42 is configured to reduce a crystallographic difference between the substrate 10 and compound semiconductor layers 44 and 50 to be formed in a subsequent process, and consequently to minimize a crystal defect density. Therefore, preferably the buffer layer 42 uses a chemically stable material that has a crystal characteristic similar to the compound semiconductor layers 44 and 50 to be formed in a subsequent process. That is, it is preferable to form the buffer layer 42 using a material having crystal structure, lattice constant and thermal expansion coefficient equal or similar to the compound semiconductor layers 44 and 50 to be formed later. Preferably, the buffer layer 42 is made of a material having the same crystal structure as the compound semiconductor layers 44 and 50 to be formed later and a difference in lattice constant of at least 20% or less with the compound semiconductor layers 44 and 50 to be formed later.

Specifically, in the case that the compound semiconductor layers 44 and 50 are made of a nitride-based compound semiconductor as mentioned below, the buffer layer 42 may be made of a GaN film, an AlN film, an AlGaN film or combination films thereof. In this case, the reaction precursors may use trimethylaluminum (TMAl), trimethylgallium (TMGa), triethylgallium (TEGa) or $GaCl_3$, and a nitride source gas may use ammonia ($NH_3$), nitrogen or tertiarybutylamine ($N(C_4H_9)H_2$). In the case of a GaN low-temperature buffer layer, the buffer layer 42 is grown with a thickness of 10 to 40 nm at a temperature range of 400 to 800° C. In the case of an AlN or AlGaN buffer layer, the buffer layer 42 is grown with a thickness of 10 to 200 nm at a temperature range of 400 to 1200° C. The buffer layer 42 may be optionally used according to the used substrate, a growth equipment (an MOCVD apparatus) or growth conditions.

In growth of the buffer layer 42 as mentioned above, the buffer layer 42 is grown faster on the substrate 10 exposed by the openings 30 than on the surface of the metal layer 20. Thus, as shown in FIG. 4, the buffer layer 42 is selectively formed on the substrate 10 in the openings 30.

Meanwhile, although this exemplary embodiment shows that, after the metal layer 20 is deposited and the spherical balls 12 are removed, the buffer layer 42 is grown in the openings 30, order of forming the buffer layer 42 may be changed. That is, before the spherical balls 12 are coated on the substrate 10, the buffer layer 42 may be formed on the entire surface of the substrate 10 and then the spherical balls 12 may be coated thereon. And, although this exemplary embodiment shows a single layered buffer layer 42, it is possible to form a multilayered buffer layer of different materials.

Subsequently, the compound semiconductor layer 44 is grown on the substrate 12 having the buffer layer 42. The compound semiconductor layer 44 may be a III-V group compound semiconductor layer or a II-VI group compound semiconductor layer that emits light of an ultraviolet-ray band, a visible-ray band or an infrared-ray band. In the case that a nitride-based compound semiconductor is used as the compound semiconductor layer 44, the compound semiconductor layer 44 may be made of, for example, GaN, AlN, InN and combination thereof (for example, $Ga_{1-x}Al_{1-y}In_{1-z}N$, $0 \leq x,y,z \leq 1$). Gallium nitride (GaN) is a direct transition type wide bandgap semiconductor, has a bandgap of 3.4 eV, and is known as a material suitable for application to a blue light emitting device or a high temperature electronic device. When depositing the compound semiconductor layer 44, a film deposition process is performed while injecting Indium (In) or aluminum (Al) individually, simultaneously or in sequence to grow an InN film, an AlN film, an InGaN film, an AlGaN film, or an InGaAlN film, thereby controlling a bandgap of a device between 1.9 and 6.2 eV. It is known that the GaN film has a bandgap of 3.4 eV, the AlN film has a bandgap of 6.2 eV and the InN film has a bandgap of 0.7 eV. AlN has a bandgap of 6.2 eV, and thus emits light of ultraviolet-ray band, $Al_xGa_{1-x}N$ ($0<x<1$) has smaller bandgap than AlN, but emits light of ultraviolet-ray band, GaN has a bandgap of 3.4 eV that is smaller than the bandgap of $Al_xGa_{1-x}N$ (0<x<1) and thus emits light of visible-ray band, $In_xGa_{1-x}N$ (0<x<1) has smaller bandgap than GaN and thus emits light of visible-ray band, and InN has a bandgap of 0.7 eV that is smaller than the bandgap of $In_xGa_{1-x}N$ (0<x<1) and thus emits light of infrared-ray band.

A preferable process for growing the compound semiconductor layer 44 may use, for example, an MOCVD (Metal Organic Chemical Vapor Deposition) method, an MBE (Molecular Beam Epitaxy) method or a HVPE (Hydride Vapor Phase Epitaxy) method.

In describing a process for forming the compound semiconductor layer 44 using the metal organic chemical vapor deposition (MOCVD) method, first, a substrate is charged in a reactor, and reaction precursors are each injected into the reactor using a carrier gas. Subsequently, the reactor precursors are chemically reacted at a predetermined range of temperature and a predetermined range of pressure to grow the compound semiconductor layer 44. In the case that the compound semiconductor layer 44 is a nitride-based film, the reaction precursors may use trimethylaluminum (TMAl), trimethylgallium (TMGa), triethylgallium (TEGa) or $GaCl_3$, and a nitride source gas may use ammonia ($NH_3$), nitrogen or tertiarybutylamine ($N(C_4H_9)H_2$). A proper temperature of the reactor is 900 to 1150° C. and a proper pressure of the reactor is $10^{-5}$ to 2000 mmHg.

A reaction equation of a process of forming a gallium nitride (GaN) film by the MOCVD method is as follows.

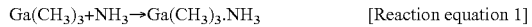

$Ga(CH_3)_3 + NH_3 \rightarrow Ga(CH_3)_3 \cdot NH_3$  [Reaction equation 1]

Trimethylgallium (TMGa) and ammonium ($NH_3$) are flowed in to produce $Ga(CH_3)_3 \cdot NH_3$.

$Ga(CH_3)_3 \cdot NH_3$ is thermally decomposed on the substrate to form a GaN film, and the GaN film is formed by the following reaction.

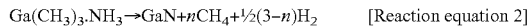

$Ga(CH_3)_3 \cdot NH_3 \rightarrow GaN + nCH_4 + \frac{1}{2}(3-n)H_2$  [Reaction equation 2]

Figure 5:
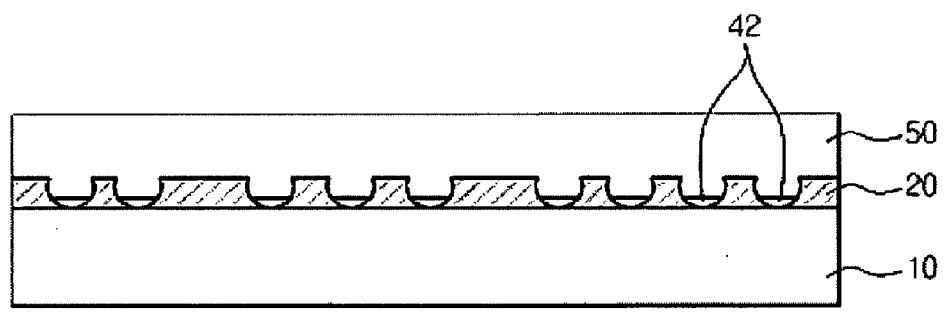

The compound semiconductor layer 44 is grown on the buffer layer 42 in the shape of a cluster or an island and absorbed by the substrate (the buffer layer), and similarly to the buffer layer 42, the compound semiconductor layer 44 is grown faster on an upper portion of the buffer layer 42 than on the surface of the metal layer 20, and then fills the openings 30 and is grown over the metal layer 20. In the case that intervals between the openings 30 are narrow, the compound semiconductor layer 44 grown over the metal layer 20 is connected with the compound semiconductor layer 44 grown from adjacent openings 30 to form a continuous layer. The compound semiconductor layer 44 grown from the openings 30 as mentioned above is continuously grown in a lateral direction to form a continuous compound semiconductor layer, and the continuous compound semiconductor layer is continuously grown to a desired thickness, thereby obtaining the compound semiconductor layer 50 that fills the openings 30 and is formed on the metal layer 20 in the shape of a continuous layer, as shown in FIG. 5. At this time, thickness of the compound semiconductor layer 50 can be properly controlled according to the required level of quality or specification.

The compound semiconductor layer 50 may be configured variously according to a compound semiconductor device to be manufactured using the compound semiconductor substrate of this exemplary embodiment. For example, the compound semiconductor layer 50 may have a single-layered configuration of the same material or a multi-layered configuration of different materials. And, when depositing the compound semiconductor layer 50, a deposition process is performed while injecting various materials of at least any one selected from the group consisting of Si, Ge, Mg, Zn, O, Se, Mn, Ti, Ni and Fe according to a target purpose of use, thereby manufacturing the compound semiconductor layer 50 containing different materials. These materials may be optionally added at the user's request to change electrical, optical or magnetic property of the compound semiconductor layer 50. The materials may be added through an in-situ doping method, an ex-situ doping method or an ion implantation method. The in-situ doping method adds materials to be added when growing a compound semiconductor layer, the ex-situ doping method injects materials into a compound semiconductor layer by heat treatment or plasma treatment after growing the compound semiconductor layer. The ion implantation method accelerates ions of materials to be added so that the ions of materials are collided with a compound semiconductor layer and injected into the compound semiconductor layer.

Meanwhile, after the compound semiconductor layer 44 is formed according to this exemplary embodiment, a thick compound semiconductor layer may be deposited by the HVPE (Hydride Vapor Phase Epitaxy) method based on the compound semiconductor layer 44, i.e. using the compound semiconductor layer 44 as a substrate. The HVPE method is a kind of vapor growth method, and flows gases on a substrate to grow a crystal by reaction of the gases. When the thick compound semiconductor layer is formed by the HVPE method, the compound semiconductor layer 44 used as a substrate is cut out or a portion except for the thick compound semiconductor layer is removed by polishing or grinding, and thus only a uniform and high quality compound semiconductor layer grown on the substrate is selected for use.

In describing a process for forming another compound semiconductor layer, for example, a GaN thick film on the compound semiconductor layer 44 using the HVPE (Hydride Vapor Phase Epitaxy) method, a container receiving Ga metal therein is arranged in a reactor, and heated by a heater installed around the container to make a Ga solution. The obtained Ga solution and HCl are reacted to make GaCl gas.

A reaction equation is as follows.

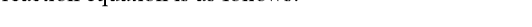

$Ga(l) + HCl(g) \rightarrow GaCl(g) + \frac{1}{2}H_2(g)$  [Reaction equation 3]

GaCl gas and ammonia ($NH_3$) are reacted to form a GaN layer, and the GaN layer is formed by the following reaction.

$GaCl(g) + NH_3 \rightarrow GaN + HCl(g) + H_2$  [Reaction equation 4]

At this time, an unreacted gas is exhausted by the following reaction.

$HCl(g) + NH_3 \rightarrow NH_4Cl(g)$  [Reaction equation 5]

The HVPE (Hydride Vapor Phase Epitaxy) method allows to grow the thick film at a fast growth ratio of about 100 μm/hr, thereby obtaining high productivity.

Figure 6:
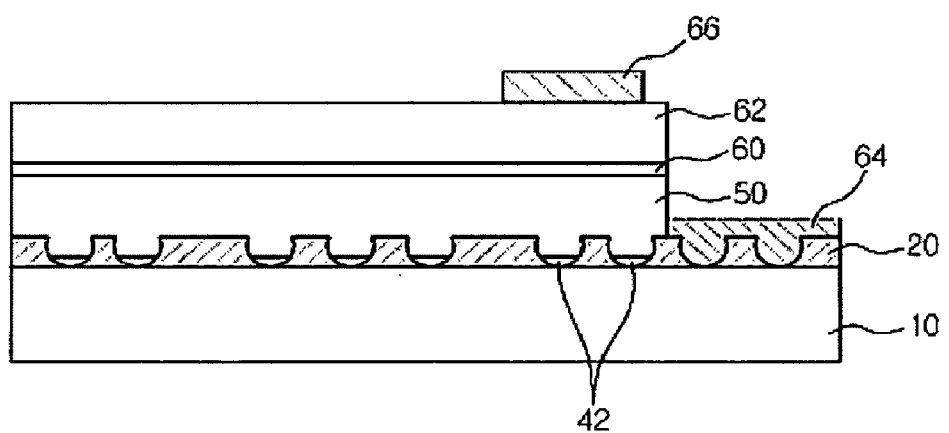

This exemplary embodiment cites an example for manufacturing a light emitting device using the compound semiconductor substrate obtained as mentioned above. That is, as shown in FIG. 6, an active layer 60 and a second compound semiconductor layer 62 is formed on the substrate 10 having the first compound semiconductor layer 50 shown in FIG. 5. Here, the first compound semiconductor layer 50 is a first conductivity type (for example, n type) compound semiconductor layer and is made of a GaN layer, for example, and the second compound semiconductor layer 62 is a second conductivity type (for example, p type) compound semiconductor layer and is made of a GaN layer, for example. And, the active layer 60 is made of an InGaN layer, for example, and may have a quantum well structure or a multiple quantum well structure.

Subsequently, the second compound semiconductor layer 62, the active layer 60 and the first compound semiconductor layer 50 are patterned to expose a portion of the metal layer 20, and a conductive material to be electrodes (electrode pads) is deposited thereon and patterned to form a first electrode 64 and a second electrode 66. The conductive material comprising the electrodes (electrode pads) may be a metal or alloy thereof used widely as an electrode of a light emitting device, for example, Ni or Au.

In the light emitting device obtained as mentioned above, the metal layer 20 is formed in the shape of a continuous layer on a plane as mentioned above, and thus the metal layer 20 is electrically connected to the first electrode (electrode pad) 64, so that the metal layer 20 serves as an electrode of the first conductivity type compound semiconductor layer 50 side to remarkably reduce electrical resistance as compared with a conventional light emitting device, thereby contributing to reduction of power consumption. And, the metal layer 20 reflects light that is generated from the active layer 60 and emitted toward the substrate 10, toward a surface side of the light emitting device (the second compound semiconductor layer 62 side) to reduce an amount of light absorbed and lost by the substrate 10, thereby remarkably improving light emitting efficiency of the light emitting device.

It should be understood that the detailed description and specific examples, while indicating preferred embodiments of the invention, are given by way of illustration only, since various changes and modifications within the spirit and scope of the invention will become apparent to those skilled in the art from this detailed description.

APPLICABILITY TO THE INDUSTRY

According to the compound semiconductor substrate and method for manufacturing the same of the present invention, the openings, through the substrate is exposed are formed in the metal layer deposited by a typical deposition method using the spherical balls, and the compound semiconductor layer is formed from the openings. Therefore, as compared with an ELO (Epitaxial Lateral Overgrowth) method using a conventional photolithography or a method for growing an epitaxial metal layer and growing a compound semiconductor layer thereon, the present invention can manufacture a high quality compound semiconductor substrate with easy control, low cost and high reproductibility and productivity.

And, according to the present invention, the metal layer serves as one electrode of the compound semiconductor device to lower electrical resistance, thereby reducing power consumption, and the metal layer also serves as a reflecting film to increase a light emitting efficiency of the light emitting device.

What is claimed is:

1. A method for manufacturing a compound semiconductor substrate, comprising:
    (a) preparing a plurality of spherical balls;
    (b) coating a plurality of the spherical balls on a substrate;
    (c) depositing a metal layer on the substrate coated with the spherical balls with a thickness smaller than size of the spherical balls;
    (d) removing a plurality of the spherical balls from the substrate having the metal layer deposited thereon;
    (e) growing a compound semiconductor layer from a surface of the substrate exposed by removing a plurality of the spherical balls;
    (f) growing the compound semiconductor layer in a lateral direction to form a continuous compound semiconductor layer on the metal layer; and
    (g) growing the compound semiconductor layer to a target thickness.

2. The method for manufacturing a compound semiconductor substrate according to claim 1,
    wherein the spherical balls have a diameter of 10 nm to 2 µm.

3. The method for manufacturing a compound semiconductor substrate according to claim 1,
    wherein the spherical balls include silicon oxide ($SiO_2$) balls, sapphire ($Al_2O_3$) balls, titanium oxide ($TiO_2$) balls, zirconium oxide ($ZrO_2$) balls, $Y_2O_3$—$ZrO_2$ balls, copper oxide (CuO, $Cu_2O$) balls, tantalum oxide ($Ta_2O_5$) balls, PZT(Pb(Zr, Ti)$O_3$) balls, $Nb_2O_5$ balls, $FeSO_4$ balls, $Fe_3O_4$ balls, $Fe_2O_3$ balls, $Na_2SO_4$ balls, $GeO_2$ balls or CdS balls.

4. The method for manufacturing a compound semiconductor substrate according to claim 1,
    wherein the metal layer is made of Pt, Ti, Cr, Al or Cu.

5. The method for manufacturing a compound semiconductor substrate according to claim 1,
    wherein the metal layer is deposited by sputtering or evaporation.

6. The method for manufacturing a compound semiconductor substrate according to claim 1, further comprising:
    before the step (b) or between the step (d) and the step (e), forming a buffer layer between the substrate and the compound semiconductor layer for relieving a crystallographic difference between the substrate and the compound semiconductor layer to minimize a crystallographic defect density of the compound semiconductor layer.

7. The method for manufacturing a compound semiconductor substrate according to claim 6,
    wherein the buffer layer is formed with a thickness of 10 to 200 nm, and made of a GaN film, an AlN film, an AlGaN film or combination films thereof.

8. The method for manufacturing a compound semiconductor substrate according to claim 1, further comprising:
    after the step (c), heat-treating the metal layer under ammonia or nitrogen atmosphere at temperature below a melting point of a metal of the metal layer.

9. The method for manufacturing a compound semiconductor substrate according to claim 1,
    wherein the compound semiconductor layer is made of a GaN film, an MN film, an Al GaN film or combination films thereof.

10. The method for manufacturing a compound semiconductor substrate according to claim 9,
    wherein the compound semiconductor layer additionally contains at least one material selected from the group consisting of Si, Ge, Mg, Zn, O, Se, Mn, Ti, Ni and Fe.

11. The method for manufacturing a compound semiconductor substrate according to claim 1,
    wherein the substrate is made of sapphire ($Al_2O_3$), GaAs, spinel, InP, SiC or Si.

* * * * *